United States Patent
RaghuRam

(10) Patent No.: US 7,365,990 B2
(45) Date of Patent: Apr. 29, 2008

(54) CIRCUIT BOARD ARRANGEMENT INCLUDING HEAT DISSIPATER

(75) Inventor: Siva RaghuRam, Germering (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/311,701

(22) Filed: Dec. 19, 2005

(65) Prior Publication Data

US 2007/0139897 A1   Jun. 21, 2007

(51) Int. Cl.
    H05K 7/20   (2006.01)
(52) U.S. Cl. .............. 361/720; 361/704; 361/719; 361/721; 165/80.3; 257/712
(58) Field of Classification Search .......... 361/690, 361/692, 688, 689, 702, 704, 720, 721, 100, 361/709, 714, 719; 174/15.1, 250, 16.1; 165/80.3, 80, 80.4, 104.33; 24/458; 257/23.09, 257/713, 712, 719; 439/74
See application file for complete search history.

(56) References Cited

U.S. PATENT DOCUMENTS

| | | | | |
|---|---|---|---|---|
| 5,396,403 A | * | 3/1995 | Patel | 361/705 |
| 5,904,581 A | * | 5/1999 | Pope et al. | 439/74 |
| 6,055,157 A | * | 4/2000 | Bartilson | 361/699 |
| 6,180,874 B1 | * | 1/2001 | Brezina et al. | 174/16.3 |
| 6,421,240 B1 | * | 7/2002 | Patel | 361/699 |
| 6,465,728 B1 | * | 10/2002 | McLaughlin et al. | 174/16.3 |
| 6,496,375 B2 | * | 12/2002 | Patel et al. | 361/719 |
| 6,829,144 B1 | * | 12/2004 | Stutzman et al. | 361/704 |
| 7,023,701 B2 | * | 4/2006 | Stocken et al. | 361/704 |
| 7,257,002 B2 | * | 8/2007 | Nagahashi | 361/704 |
| 7,289,331 B2 | * | 10/2007 | Foster et al. | 361/719 |
| 2002/0034068 A1 | * | 3/2002 | Weber et al. | 361/790 |
| 2002/0063327 A1 | * | 5/2002 | Chu et al. | 257/706 |
| 2005/0051297 A1 | * | 3/2005 | Kuo | 165/80.3 |
| 2006/0019518 A1 | * | 1/2006 | Lam et al. | 439/119 |
| 2006/0022310 A1 | * | 2/2006 | Egitto et al. | 257/642 |
| 2006/0049513 A1 | * | 3/2006 | Goodwin | 257/712 |
| 2006/0221573 A1 | * | 10/2006 | Li | 361/704 |
| 2007/0211438 A1 | * | 9/2007 | Foster et al. | 361/721 |
| 2007/0230139 A1 | * | 10/2007 | Haba | 361/719 |
| 2007/0258217 A1 | * | 11/2007 | Roper et al. | 361/709 |

OTHER PUBLICATIONS

Sep. 25, 2000, Engineering Fundamentals, http://web.archive.org/web/20000925230635/http://www.efunda.com/processes/metal.*

* cited by examiner

Primary Examiner—Boris Chérvinsky
Assistant Examiner—Courtney L Smith
(74) Attorney, Agent, or Firm—Slater & Matsil, L.L.P.

(57) ABSTRACT

A circuit board arrangement includes a heat dissipater. A cooling body is arranged near a first circuit board and a second circuit board. Both circuit boards have electronic devices on two major surfaces. The cooling body is arranged between the electronic devices on one surface of the first circuit board and the electronic devices on one surface of the second circuit board. The circuit boards are supported by fixing elements of the cooling body.

31 Claims, 5 Drawing Sheets

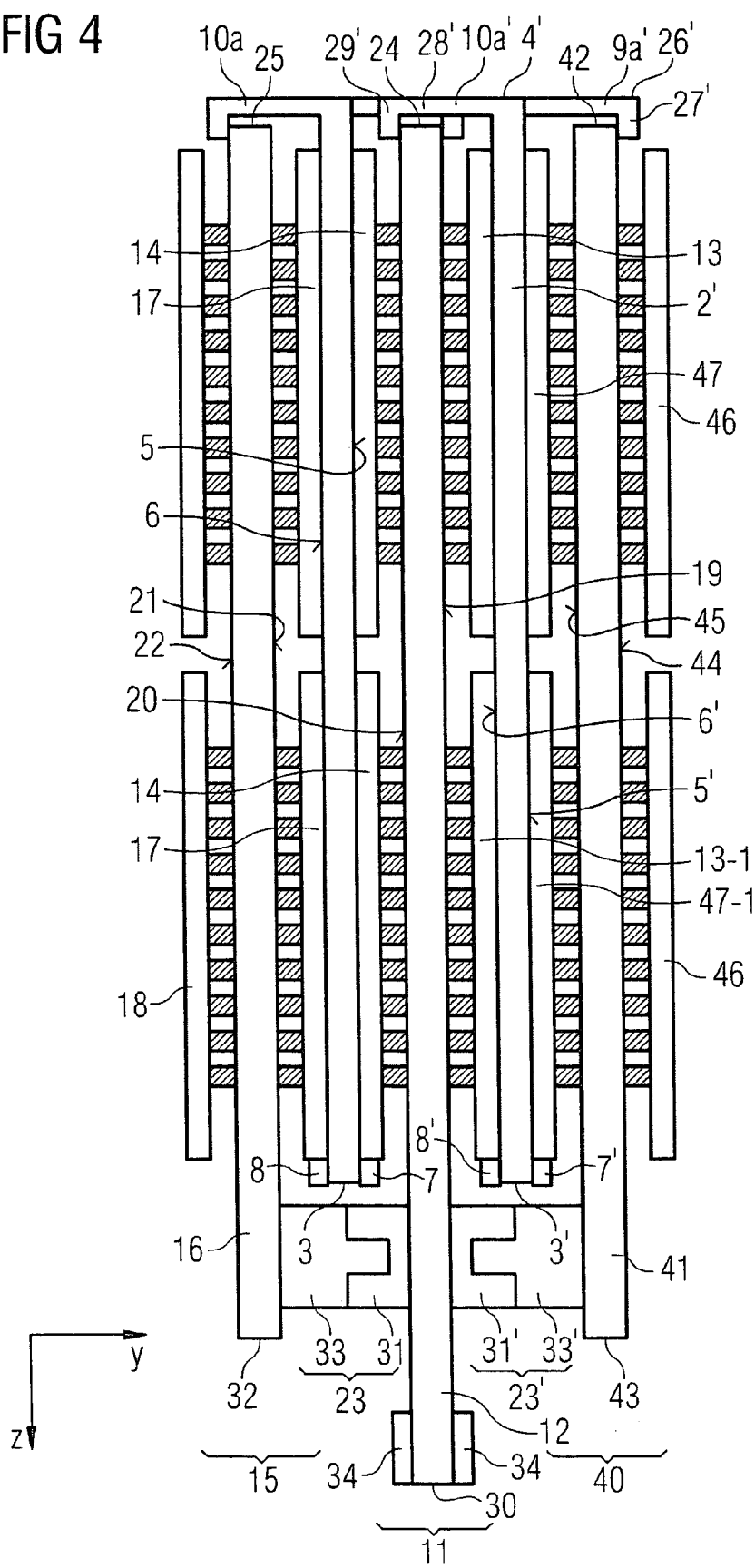

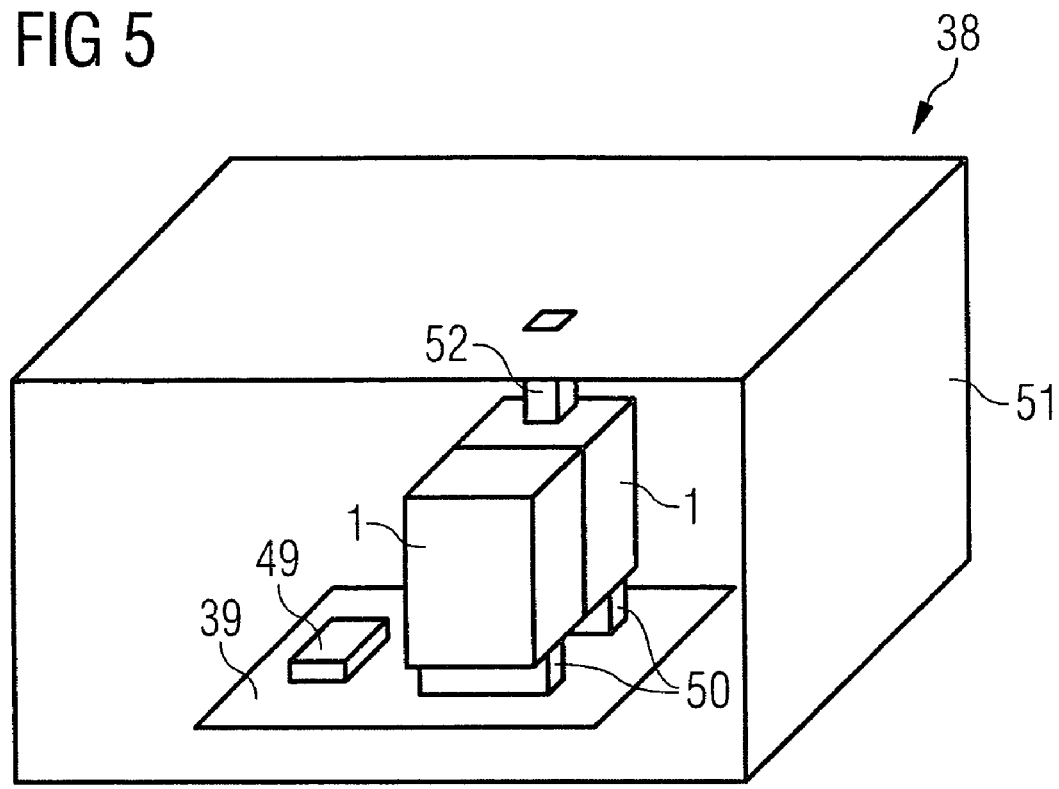

CIRCUIT BOARD ARRANGEMENT INCLUDING HEAT DISSIPATER

TECHNICAL FIELD

The present invention relates to a circuit board arrangement and in particular to a circuit board arrangement with a heat dissipation means for the reduction of the temperature of electronic devices of the circuit board arrangement.

BACKGROUND

Computers typically have means for cooling some components like the central processing unit (CPU) to avoid damage to the components or to adjacent devices by excessive heat generated by those components. The means for cooling may include a fan that is installed inside the housing of the computer. The fan effects a defined airflow to provide cooling of the components.

Such computers usually have a memory associated with the CPU, particularly a dynamic random access memory (DRAM). The memory comprises a multiplicity of electronic devices disposed on a circuit board. The circuit board including the multiplicity of electronic devices is commonly referred to as memory module.

The memory module has a number of contacts (pins) that may be arranged according to specific standards for providing electrical connection between the memory module and a module socket of a motherboard of the computer when inserted into slots provided on the motherboard. Depending on the number of slots being present on the motherboard, several memory modules may be installed in a computer.

In the past, only moderate heat was generated by the memory modules, and the airflow produced by the fan provided sufficient cooling. Commonly, the slots are arranged such that the memory modules extend perpendicularly or inclined from the motherboard. The air-gap between adjacent memory modules was sufficient to effect cooling of the memory devices by the defined airflow.

With increasing integration, the density of electronic devices disposed on the circuit board has been increased. Furthermore, the distance between adjacent slots of the motherboard is continuously reduced. Therefore, the airflow provided by the fan may not provide sufficient cooling for the memory modules to prevent malfunction of the modules. What is desired is an arrangement of modules, that provides improved cooling properties.

SUMMARY OF THE INVENTION

One embodiment of the present invention provides a circuit board arrangement including a heat dissipater. The circuit board arrangement comprises a cooling body that has a first edge, a second edge and a first surface and a second surface. The cooling body has at least one first fixing element disposed at the first edge of the cooling body, at least one second fixing element disposed at the first edge of the cooling body, at least one third fixing element disposed at the second edge of the cooling body and at least one fourth fixing element disposed at the second edge of the cooling body. The circuit board arrangement further comprises a first module that comprises a first circuit board. The first circuit board of the first module has a first edge and a first surface and a second surface and at least a first electronic device disposed on the first surface of the first circuit board and a second electronic device disposed on the second surface of the first circuit board. The circuit board arrangement further comprises a second module that comprises a second circuit board. The second circuit board of the second module has a first edge and a first surface and a second surface and at least a first electronic device disposed on the first surface of the second circuit board and a second electronic device disposed on the second surface of the second circuit board. The circuit board arrangement further comprises a connector wherein the connector electrically couples the first circuit board and the second circuit board. The cooling body is disposed between the second electronic device of the first circuit board and the first electronic device of the second circuit board. The at least one first fixing element supports the second electronic device of the first circuit board and the at least one second fixing element supports the first electronic device of the second circuit board. The at least one third fixing element fixes the first edge of the first circuit board and the at least one fourth fixing element fixes the first edge of the second circuit board.

Another embodiment of the present invention provides a computer comprising a circuit board arrangement according to one embodiment of the invention. The computer further comprises a motherboard having a central processing unit and a socket disposed thereon, wherein the circuit board arrangement is plugged into the socket.

BRIEF DESCRIPTION OF THE DRAWINGS

For a more complete understanding of the present invention, and the advantages thereof, reference is now made to the following descriptions taken in conjunction with the accompanying drawing, in which:

FIG. 4 depicts a cross-sectional view of a circuit board arrangement according to one embodiment of the present invention; and FIG. 5 shows schematically a computer having a circuit board arrangement according to one embodiment of the present invention.

The following list of reference symbols can be used in conjunction with the figures:

| | |
|---|---|
| 1 | Arrangement |
| 2 | Cooling body |
| 3 | First edge of cooling body |
| 4 | Second edge of cooling body |
| 5 | First surface of cooling body |
| 6 | Second surface of cooling body |
| 7 | Fixing element |
| 8 | Fixing element |
| 9 | Fixing element |
| 10 | Fixing element |
| 11 | First module |
| 12 | First circuit board |
| 13 | Electronic device |
| 14 | Electronic device |
| 15 | Second module |
| 16 | Second circuit board |
| 17 | Electronic device |
| 18 | Electronic device |
| 19 | First surface of first circuit board |

-continued

| | |
|---|---|
| 20 | Second surface of first circuit board |
| 21 | First surface of second circuit board |
| 22 | Second surface of second circuit board |
| 23 | Connector |
| 24 | First edge of first circuit board |
| 25 | First edge of second circuit board |
| 26 | First portion of third fixing element |
| 27 | Second portion of third fixing element |
| 28 | First portion of fourth fixing element |
| 29 | Second portion of fourth fixing element |
| 30 | Second edge of first circuit board |
| 31 | Socket |
| 32 | Second edge of second circuit board |
| 33 | Plug |
| 34 | Contact |
| 35 | Third edge of first circuit board |
| 36 | Third edge of second circuit board |
| 37 | Metal sheet |
| 38 | Computer |
| 39 | Motherboard |
| 40 | Third module |
| 41 | Third circuit board |
| 42 | First edge of third circuit board |
| 43 | Second edge of third circuit board |
| 44 | First surface of third circuit board |
| 45 | Second surface of third circuit board |
| 46 | First electronic device of third circuit board |
| 47 | Second electronic device of third circuit board |
| 48 | Electrical connection |
| 49 | CPU |
| 50 | Socket |
| 51 | Housing |
| 52 | Coupling element |

DETAILED DESCRIPTION OF ILLUSTRATIVE EMBODIMENTS

Figure 1:
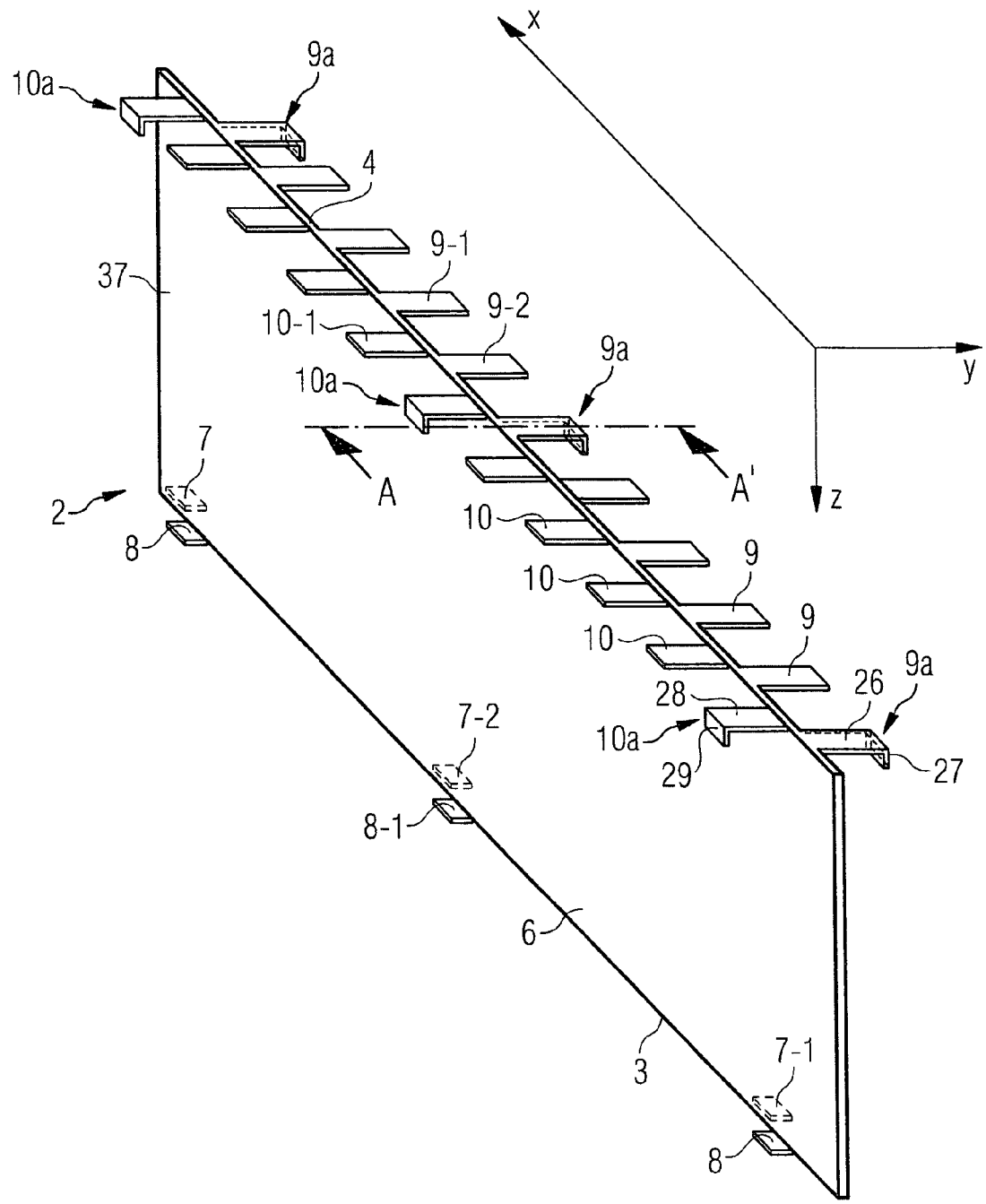
FIG. 1 depicts a perspective view of a cooling body for the implementation in a circuit board arrangement according to one embodiment of the invention.

FIG. 1 depicts a perspective view of a cooling body 2 for the implementation in a circuit board arrangement 1 (not shown in FIG. 1) according to one embodiment of the present invention. The cooling body 2 may comprise a material that has a large thermal conductivity. Preferably, the material is a metal, for example copper or aluminum. The cooling body 2 includes a sheet-shaped portion 37 that extends along a plane spanned by the X direction and the Z direction as depicted in the coordinate system.

The cooling body 2 has a first edge 3 and a second edge 4 and a first surface 5 (not shown in FIG. 1) and a second surface 6. The first edge 3 and the second edge 4 extend along the first direction X.

First fixing elements 7 are disposed at the first edge 3 of the cooling body 2 and extend from the first edge 3 of the cooling body 2 along a second direction Y, that is different from the first direction X.

Second fixing elements 8 are disposed at the first edge 3 of the cooling body 2 and extend from the first edge 3 of the cooling body 2 along a direction opposite to the second direction Y. A second fixing element 8-1 is disposed between adjacent first fixing elements 7-1, 7-2.

Furthermore, the cooling body 2 has third fixing elements 9, 9a disposed at the second edge 4 of the cooling body 2 and fourth fixing elements 10, 10a disposed at the second edge 4 of the cooling body 2. A fourth fixing element 10-1 is disposed between adjacent third fixing elements 9-1, 9-2.

A subset of third fixing elements 9 extend from the second edge 4 of the cooling body 2 along the second direction Y and a subset of fourth fixing elements 10 extend from the second edge 4 of the cooling body 2 along the direction opposite to the second direction Y. Another subset of third fixing elements 9a comprise a first portion 26 that extends along the second direction Y and a second portion 27 that extends along a third direction Z. The third direction Z is preferably perpendicular to the first direction X and to the second direction Y. Another subset of fourth fixing elements 10a comprise a first portion 28 that extends along the direction opposite to the second direction Y and a second portion 29 that extends along the third direction Z.

Preferably the cooling body 2 has three third fixing elements 9a that comprise the first portion 26 and the second portion 27, wherein two of the third fixing elements 9a are disposed in vicinity to distant ends of the second edge 4 of the cooling body 2 and wherein a third of the three third fixing elements 9a is disposed between the ones disposed in vicinity to the distant ends of the second edge 4 of the cooling body 2. Preferably the cooling body 2 has three fourth fixing elements 10a that comprise the first portion 28 and the second portion 29, wherein two of the fourth fixing elements 10a are disposed in vicinity to distant ends of the second edge 4 of the cooling body 2 and wherein a third of the three fourth fixing elements 10a is disposed between the ones disposed in vicinity to the distant ends of the second edge 4 of the cooling body 2.

The cooling body 2 may be formed from a single sheet of metal by a two-step fabrication process. In a first step, a single sheet of metal is punched or cut such that a sheet having the outline of an unfolded cooling body 2 is formed. In a second step, first 7, second 8, third 9 and fourth 10 fixing elements are formed by means of folding. The sheet of metal may have a thickness of between 0.4 mm and 0.6 mm, preferably of 0.5 mm.

Figure 2:
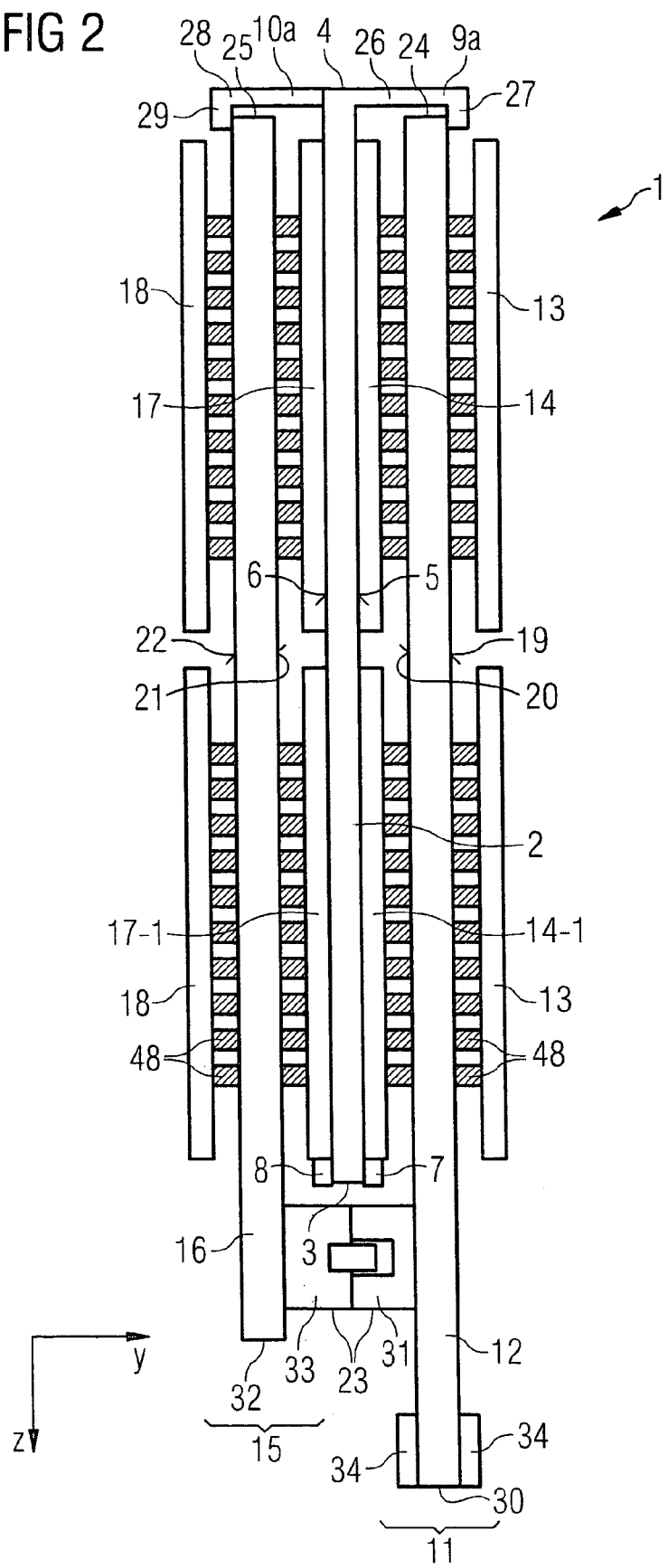
FIG. 2 depicts a cross-sectional view of a circuit board arrangement according to one embodiment of the present invention.

FIG. 2 depicts a cross-sectional view of a circuit board arrangement 1 according to one embodiment of the present invention. The circuit board arrangement 1 comprises a first module 11, a second module 15 and a cooling body 2.

The first module 11 comprises a first circuit board 12. The first circuit board 12 of the first module 11 has a first edge 24 and a second edge 30 disposed opposite the first edge 24, wherein the first edge 24 and the second edge 30 extend along a first direction X (not shown in FIG. 2) that extends orthogonal to the plane spanned by the Y-direction and the Z-direction as depicted in the coordinate system. Furthermore, the first circuit board 12 has a first surface 19 and a second surface 20. First electronic devices 13 are disposed on the first surface 19 of the first circuit board 12 and second electronic devices 14 are disposed on the second surface 20 of the first circuit board 12. First 13 and second 14 electronic devices are electrically connected to the first circuit board 12. The electrical connection 48 between the first electronic devices 13 and the first circuit board 12 and between the second electronic devices 14 and the first circuit board 12 may be established by solder balls.

The second module 15 comprises a second circuit board 16. The second circuit board 16 has a first edge 25 and a second edge 32 opposite the first edge 25, wherein the first edge 25 and the second edge 32 extend along the X-direction. Furthermore, the second circuit board 16 has a first surface 21 and a second surface 22. First electronic devices 17 are disposed on the first surface 21 of the second circuit board 16 and second electronic devices 18 are disposed on the second surface 22 of the second circuit board 16.

First 17 and second 18 electronic devices are electrically coupled to the second circuit board 16. The electrical connection 48 between the first electronic devices 17 and the second circuit board 16 and between the second electronic devices 18 and the second circuit board 16 may be established by solder balls. First 11 and second 15 modules of the circuit board arrangement 1 may include a dual inline memory module (DIMM) which may include a plurality of semiconductor devices. First 12 and second 16 circuit boards may include printed circuit boards. First 13 and second 14 electronic devices of the first circuit board 12 and first 17 and second 18 electronic devices of the second circuit board 16 may include integrated circuits, memory integrated circuits or a data storage element, for example a dynamic random access memory (DRAM).

The cooling body 2 is disposed between the second electronic devices 14 of the first circuit board 12 and the first electronic devices 17 of the second circuit board 16. The cooling body 2 has a first edge 3 and a second edge 4 that extend along the first direction X, and a first surface 5 and a second surface 6. Furthermore, the cooling body 2 has at least one first fixing element 7 disposed at the first edge 3 of the cooling body 2. The first fixing element 7 extends from the first edge 3 of the cooling body 2 along a second direction Y. Furthermore, the cooling body 2 has at least a third fixing element 9a that extends from the second edge 4 of the cooling body along the second direction Y. The first fixing element 7 and the third fixing element 9a hold the first circuit board 12 in fixed relationship with the cooling body 2. The first fixing element 7 supports a second electronic device 14-1 of the first circuit board 12. The third fixing element 9a has a first portion 26 that extends from the second edge 4 of the cooling body 2 along the second direction Y and a second portion 27 that extends along a third direction Z. The first edge 24 of the first circuit board 12 is disposed between the second portion 27 of the third fixing element 9a and the first surface 5 of the cooling body 2. The third fixing element 9a clamps the first edge 24 of the first circuit board 12. A section of the first surface 19 of the first circuit board 12, the section being located in vicinity to the first edge 24 of the first circuit board 12 is in contact with the second portion 27 of the third fixing element 9a.

The first surface 5 of the cooling body 2 faces the second surface 20 of the first circuit board 12. The second electronic device 14 of the first circuit board 12 is in contact with the first surface 5 of the cooling body 2 and thermally coupled to the first surface 5 of the cooling body 2.

Preferably, a thermally conductive paste is disposed between the first surface 5 of the cooling body 2 and the second electronic device 14 of the first circuit board 12. The thermally conductive paste is in contact with the first surface 5 of the cooling body 2 and in contact with the second electronic device 14 of the first circuit board 12.

The cooling body 2 has a third fixing element 8 disposed at the first edge 3 of the cooling body 2 and extending along a direction opposite to the second direction Y. Furthermore, the cooling body 2 has a fourth fixing element 10a disposed at the second edge 4 of the cooling body 2. The fourth fixing element 10a of the cooling body includes a first portion 28 that extends from the second edge 4 of the cooling body 2 along the direction opposite to the second direction Y and a second portion 29 that extends along the third direction Z.

The second fixing element 8 supports the first electronic device 17-1 of the second circuit board 16. The first edge 25 of the second circuit board 16 is disposed between the second portion 29 of the fourth fixing element 10a and the second surface 6 of the cooling body 2. The second fixing element 8 and the fourth fixing element 10a hold the second circuit board 16 in fixed relationship with the cooling body 2. The fourth fixing element 10a clamps the first edge 25 of the second circuit board 16. A section of the second surface 22 of the second circuit board 16, the section being located in vicinity to the first edge 25 of the second circuit board 16, is in contact with the second portion 29 of the fourth fixing element 10a. The second surface 6 of the cooling body 2 faces the first surface 21 of the second circuit board 16. The first electronic device 17 of the second circuit board 16 is in contact with the second surface 6 of the cooling body 2 and thermally coupled to the second surface 6 of the cooling body 2.

Preferably a thermally conductive paste is in contact with the second surface 6 of the cooling body 2 and the first electronic device 17 of the second circuit board 16.

Due to the thermal contact between the cooling body 2 and the second electronic device 14 of the first circuit board 12 and the first electronic device 17 of the second circuit board 16, heat generated by the second electronic device 14 of the first circuit board 12 and by the first electronic device 17 of the second circuit board 16 is transferred to the cooling body 2. The heat is then dissipated from the cooling body 2 to the surrounding air by the third 9, 9a and fourth 10, 10a fixing elements. Thus, a relatively low temperature of the second electronic device 14 of the first circuit board 12 and the first electronic device 17 of the second circuit board 16 may be maintained. Maintaining a relatively low temperature of the electronic device 14, 17 may reduce a malfunction of the first module 11 and the second module 12 and improve the operational reliability of the circuit board arrangement 1.

Contacts 34 are disposed on the first 19 and second 20 surface of the first circuit board 12 in vicinity to the second edge 30 of the first circuit board 12. The contacts 34 may provide an electrical connection with a module socket of a motherboard of a computer.

The first 12 and the second 16 circuit boards are electrically coupled by a connector 23. The connector 23 includes a socket 31 that is disposed on the second surface 20 of the first circuit board 12 between the contacts 34 of the first circuit board 12 and the second electronic device 14-1 of the first circuit board 12. The connector 23 further includes a plug 33 that is disposed on the first surface 21 of the second circuit board 16 between the second edge 32 of the second circuit board 16 and the first electronic device 17-1 of the second circuit board 16. The connector 23 may further increase the mechanical stability of the circuit board arrangement 1.

Figure 3:
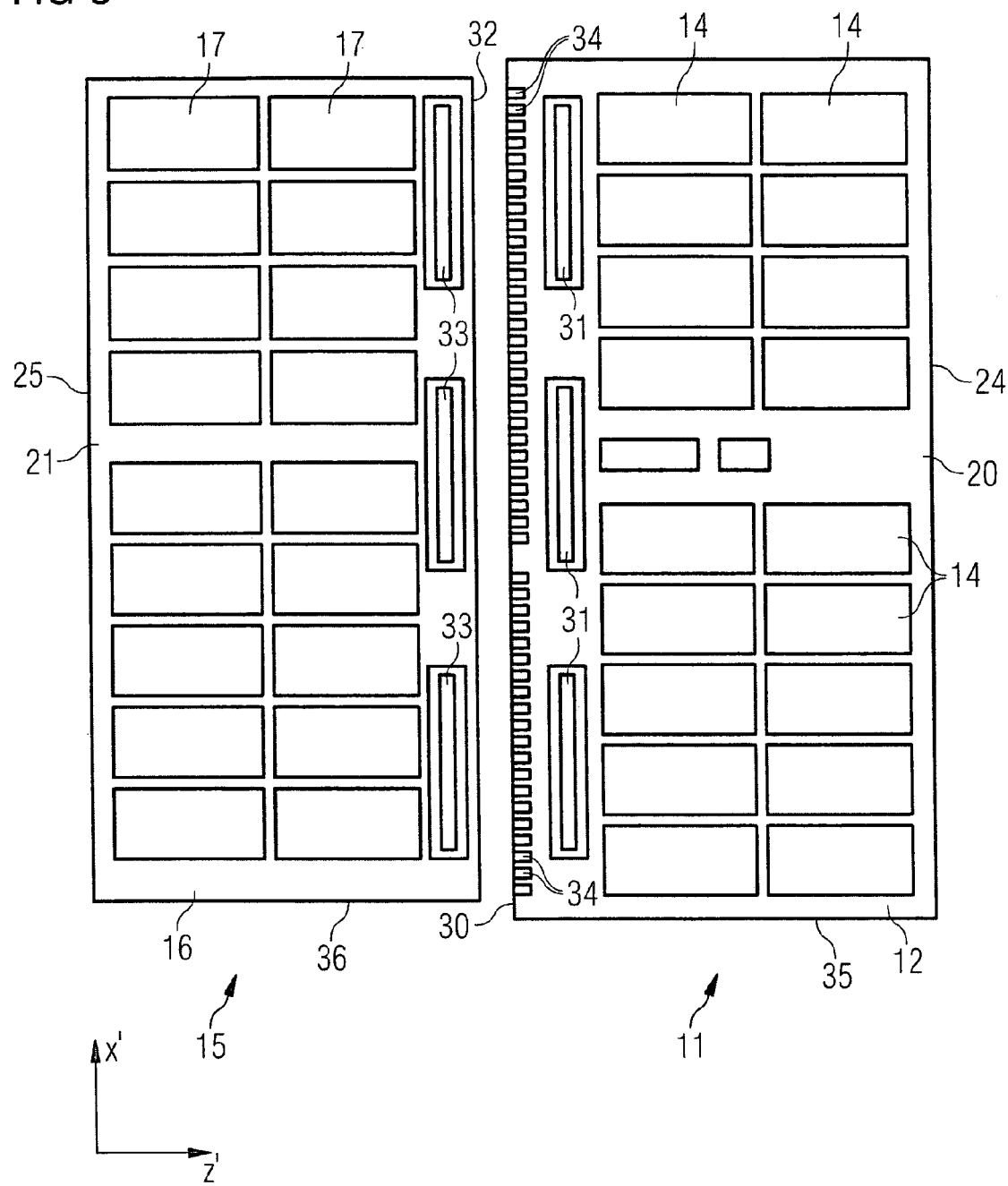
FIG. 3 depicts a plan view of circuit boards for the implementation in a circuit board arrangement according to one embodiment of the present invention.

FIG. 3 depicts a plan view of modules 11, 15 for the implementation in a circuit board arrangement 1 according to one embodiment of the present invention. A first module 11 comprises a first circuit board 12 and second electronic devices 14. The first circuit board 12 has a first edge 24 and a second edge 30, that extend along a first direction X'. Contacts 34 are disposed at the second edge 30. Second electronic devices 14 are disposed on a second surface 20 of the first circuit board 12. Sockets 31 are disposed on the second surface 20 of the first circuit board 12 between the contacts 34 and the second electronic devices 14.

A second module 15 comprises a second circuit board 16 and first electronic devices 17. The second circuit board 16 has a first edge 25 and a second edge 32, that extend along the first direction X'. Plugs 33 are disposed on a first surface 21 of the second circuit board 16 in vicinity to the second edge 32 of the second circuit board 16. The first electronic devices 17 are disposed on the first surface 21 of the second circuit board 16 between the plugs 33 and the first edge 25 of the second circuit board 16.

A third edge 35 of the first circuit board 12, the third edge 35 extending along a second direction Z', is larger than a third edge 36 of the second circuit board 16, the third edge 36 of the second module 15 extending along the third direction Z'.

FIG. 4 depicts a circuit board arrangement as depicted in FIG. 2, wherein another socket 31' is disposed on the first surface 19 of the first circuit board 12, the other socket 31' being disposed between the contacts 34 and the first electronic device 13-1 of the first circuit board 12. The arrangement further comprises a third module 40 and another cooling body 2'.

The third module 40 comprises a third circuit board 41. The third circuit board has a first edge 42 and a second edge 43 disposed opposite the first edge 42, wherein the first edge 42 and the second edge 43 extend along a first direction X (not shown in FIG. 4) that extends orthogonal to the plane spanned by the Y-direction and the Z-direction as depicted in the coordinate system. Furthermore, the third circuit board 41 has a first surface 44 and a second surface 45. First electronic devices 46 of the third circuit board 41 are disposed on the first surface 44 of the third circuit board 41 and second electronic devices 47 are disposed on the second surface 45 of the third circuit board 41. First 46 and second electronic devices 47 are electrically connected to the third circuit board 41.

The other cooling body 2' is disposed between the first electronic devices 13 of the first circuit board 12 and the second electronic devices 47 of the third circuit board 41. The other cooling body 2' has a first edge 3' and a second edge 4' that extend along the first direction X, and a first surface 5' and a second surface 6'. Furthermore, the other cooling body 2' has at least one first fixing element 7' disposed at the first edge 3' of the other cooling body 2'. The first fixing element 7' extends from the first edge 3' of the other cooling body 2' along a second direction Y. Furthermore, the other cooling body 2' has at least a third fixing element 9a' that extends from the second edge 4' of the other cooling body 2' along the second direction Y. The first fixing element 7' and the third fixing element 9' hold the third circuit board 41 in fixed relationship with the other cooling body 2'. The first fixing element 7' supports a second electronic device 47-1 of the third circuit board 41. The third fixing element 9a' has a first portion 26' that extends from the second edge 4' of the other cooling body 2' along the second direction Y and a second portion 27' that extends along a third direction Z. The first edge 42 of the third circuit board 41 is disposed between the second portion 27' of the third fixing element 9a' and the first surface 5' of the other cooling body 2'. The third fixing element 9a' clamps the first edge 42 of the third circuit board 41. A section of the first surface 44 of the third circuit board 41, the section being located in vicinity to the first edge 42 of the third circuit board 41, is in contact with the second portion 27' of the third fixing element 9a'.

The other cooling body 2' has a third fixing element 8' disposed at the first edge 3' of the other cooling body 2' and extending along a direction opposite to the second direction Y. Furthermore, the other cooling body 2' has a fourth fixing element 10a' disposed at the second edge 4' of the other cooling body 2'. The fourth fixing element 10a' of the other cooling body 2' includes a first portion 28' that extends from the second edge 4' of the other cooling body 2' along the direction opposite to the second direction Y and a second portion 29' that extends along the third direction Z.

The second fixing element 8' supports the first electronic device 13-1 of the first circuit board 12. The first edge 24 of the first circuit board 12 is disposed between the second portion 29' of the fourth fixing element 10a' and the second surface 6' of the other cooling body 2'. The second fixing element 8' and the fourth fixing element 10a' hold the first circuit board 12 in fixed relationship with the other cooling body 2'. The fourth fixing element 10a' clamps the first edge 24 of the first circuit board 12. A section of the second surface 20 of the first circuit board 12, the section being located in vicinity to the first edge 24 of the first circuit board 12, is in contact with the second portion 29' of the fourth fixing element 10a'. The second surface 6' of the other cooling body 2' faces the first surface 19 of the first circuit board 12. The first electronic device 13-1 of the first circuit board 12 is in contact with the second surface 6' of the other cooling body 2' and thermally coupled to the second surface 6' of the other cooling body 2'.

The first 12 and the third 41 circuit boards are electrically coupled by another connector 23'. The other connector 23' includes another socket 31' and another plug 33' that is disposed on the second surface 45 of the third circuit board 41 between the second edge 43 of the third circuit board 41 and the second electronic device 47-1 of the third circuit board 41.

FIG. 5 shows schematically a computer 38 comprising a housing 51, a motherboard 39 having a CPU 49 and sockets 50 disposed thereon. Circuit board arrangements 1 according to one embodiment of the present invention are plugged into the sockets 50. A thermally conductive coupling element 52 is coupled between the cooling body 2 of the circuit board arrangement 1 and the housing 51 for the dissipation of heat from the cooling body 2 to the housing 51.

What is claimed is:

1. A circuit board arrangement, comprising:
a cooling body having a first edge and a second edge and having a first surface and a second surface and having at least one first fixing element disposed at said first edge of said cooling body, at least one second fixing element disposed at said first edge of said cooling body, at least one third fixing element disposed at said second edge of said cooling body and at least one fourth fixing element disposed at said second edge of said cooling body;
a first module comprising a first circuit board having a first edge, a first surface, a second surface, at least a first electronic device disposed on said first surface of said first circuit board and a second electronic device disposed on said second surface of said first circuit board;
a second module comprising a second circuit board having a first edge, a first surface, a second surface, at least a third electronic device disposed on said first surface of said second circuit board and a second electronic device disposed on said second surface of said second circuit board; and
at least one connector electrically coupling said first circuit board and said second circuit board;
wherein:
said cooling body is disposed between said second electronic device of said first circuit board and said third electronic device of said second circuit board;
said at least one first fixing element supports said second electronic device of said first circuit board and said at least one second fixing element supports said third electronic device of said second circuit board; and
said at least one third fixing element secures said first edge of said first circuit board and said at least one fourth fixing element secures said first edge of said second circuit board.

2. The circuit board arrangement of claim 1, wherein said first surface of said cooling body faces said second surface of said first circuit board and said second surface of said cooling body faces said first surface of said second circuit board.

3. The circuit board arrangement of claim 1, wherein at least one first fixing element and said at least one third fixing element hold said first circuit board in fixed relationship with said cooling body.

4. The circuit board arrangement of claim 3, wherein said at least one second fixing element and said at least one fourth fixing element hold said second circuit board in fixed relationship with said cooling body.

5. The circuit board arrangement of claim 1, wherein said at least one third fixing element clamps said first edge of said first circuit board.

6. The circuit board arrangement of claim 1, wherein said at least one fourth fixing element clamps said first edge of said second circuit board.

7. The circuit board arrangement of claim 1, further comprising another fixing element disposed adjacent to said at least one first fixing element, wherein said at least one second fixing element is disposed between said at least one first fixing element and said another first fixing element.

8. The circuit board arrangement of claim 7, further comprising another third fixing element disposed adjacent to said at least one third fixing element, wherein said at least one fourth fixing element is disposed between said at least one third fixing element and said another third fixing element.

9. The circuit board arrangement of claim 1, wherein said first circuit board has a second edge disposed opposite said first edge of said first circuit board, and wherein said connector comprises a socket disposed on said second surface of said first circuit board between said second edge of said first circuit board and said second electronic device of said first circuit board.

10. The circuit board arrangement of claim 9, wherein said second circuit board has a second edge disposed opposite said first edge of said second circuit board, said connector comprising a plug disposed on said first surface of said second circuit board between said second edge of said second circuit board and said first electronic device of said second circuit board.

11. The circuit board arrangement of claim 1, wherein said second electronic device of said first circuit board is thermally coupled to said first surface of said cooling body.

12. The circuit board arrangement of claim 11, wherein said third electronic device of said second circuit board is thermally coupled to said second surface of said cooling body.

13. The circuit board arrangement of claim 1, further comprising a thermally conductive paste in contact with said first surface of said cooling body and in contact with said second electronic device of said first circuit board, and also comprising thermally conductive paste in contact with said second surface of said cooling body and in contact with said third electronic device of said second circuit board.

14. The circuit board arrangement of claim 1, wherein said first and second electronic devices of said first circuit board and said third and fourth electronic devices of said second circuit board comprise integrated circuits.

15. The circuit board arrangement of claim 1, wherein said first and second electronic devices of said first circuit board and said third and fourth electronic devices of said second circuit board comprise dynamic random access memories.

16. The circuit board arrangement of claim 1, wherein said first circuit board has contacts disposed in vicinity to said second edge of said first circuit board.

17. The circuit board arrangement of claim 1, wherein said cooling body comprises a metal sheet.

18. The circuit board arrangement of claim 17, wherein said metal comprises at least material selected from the group consisting of copper and aluminium.

19. The circuit board arrangement of claim 17, wherein said metal sheet has a thickness of between 0.4 mm and 0.6 mm.

20. The circuit board arrangement of claim 17, wherein said cooling body and said at least one first, second, third and fourth fixing elements are made from a single sheet of metal.

21. The circuit board arrangement of claim 1, wherein said first edge and said second edge of said cooling body extend along a first direction, said at least one first fixing element extends from said first edge of said cooling body along a second direction, and said at least one second fixing element extends from said first edge of said cooling body along a direction opposite to said second direction.

22. The circuit board arrangement of claim 21, wherein said at least one third fixing element extends from said second edge of said cooling body along said second direction, and said at least one fourth fixing element extends from said second edge of said cooling body along said direction opposite to said second direction.

23. The circuit board arrangement of claim 22, wherein said at least one third fixing element comprises a first portion extending along said second direction and a second portion extending along a third direction, and wherein said third direction is substantially perpendicular to said first direction and to said second direction.

24. The circuit board arrangement of claim 23, wherein said at least one fourth fixing element comprises a first portion extending along said direction opposite said second direction and a second portion extending along said third direction.

25. The circuit board arrangement of claim 24, wherein said first circuit board has a third edge extending along said third direction and said second circuit board has a third edge extending along said third direction, wherein said third edge of said first circuit board is larger than said third edge of said second circuit board.

26. The circuit board arrangement of claim 25, wherein said first edge of said first circuit board is disposed between said second portion of said at least one third fixing element and said first surface of said cooling body and wherein said second electronic device of said first circuit board is in contact with said at least one first fixing element.

27. The circuit board arrangement of claim 26, wherein said first edge of said second circuit board is disposed between said second portion of said at least one fourth fixing element and said second surface of said cooling body and wherein said first electronic device of said second circuit board is in contact with said at least one second fixing element.

28. The circuit board arrangement of claim 1, wherein said at least one first electronic device of said first circuit board and said second electronic device of said first circuit board are coupled to said first circuit board by solder balls and wherein said at least one third electronic device of said second circuit board and said fourth electronic device of said second circuit board are coupled to said second circuit board by solder balls.

29. The circuit board arrangement of claim 1, further comprising:
- another cooling body having a first edge and a second edge and having a first surface and a second surface and having at least one first fixing element disposed at said first edge of said another cooling body, at least one second fixing element disposed at said first edge of said another cooling body, at least one third fixing element disposed at said second edge of said another cooling body and at least one fourth fixing element disposed at said second edge of said another cooling body;
- a third module comprising a third circuit board having a first edge and a first surface and a second surface and at least a fifth electronic device disposed on said first surface of said third circuit board and a sixth electronic device disposed on said second surface of said third circuit board; and
- another connector electrically coupling said first circuit board and said third circuit board;
- wherein:
  - said another cooling body is disposed between said first electronic device of said first circuit board and said sixth electronic device of said second circuit board;
  - said at least one first fixing element of said another cooling body supports said second electronic device of said third circuit board and said at least one second fixing element of said another cooling body supports said first electronic device of said first circuit board; and
  - said at least one third fixing element of said another cooling body secures said first edge of said third circuit board and said at least one fourth fixing element of said another cooling body secures said first edge of said first circuit board.

30. A computer comprising:
- a memory module comprising:
  - a cooling body having a first edge and a second edge and having a first surface and a second surface and having at least one first fixing element disposed at said first edge of said cooling body, at least one second fixing element disposed at said first edge of said cooling body, at least one third fixing element disposed at said second edge of said cooling body and at least one fourth fixing element disposed at said second edge of said cooling body;
  - a first module comprising a first circuit board having a first edge, a first surface, a second surface, at least a first memory device disposed on said first surface of said first circuit board and a second memory device disposed on said second surface of said first circuit board;
  - a second module comprising a second circuit board having a first edge, a first surface, a second surface, at least a third memory device disposed on said first surface of said second circuit board and a second memory device disposed on said second surface of said second circuit board; and
  - at least one connector electrically coupling said first circuit board and said second circuit board;
  - wherein:
    - said cooling body is disposed between said second memory device of said first circuit board and said third memory device of said second circuit board;
    - said at least one first fixing element supports said second memory device of said first circuit board and said at least one second fixing element supports said third memory device of said second circuit board; and
    - said at least one third fixing element secures said first edge of said first circuit board and said at least one fourth fixing element secures said first edge of said second circuit board;
- a motherboard having a central processing unit and a socket disposed thereon, wherein said memory module is plugged into said socket.

31. The computer according to claim 30, further comprising a housing and a thermally conductive coupling element coupled between said cooling body and said housing.

* * * * *